(12) United States Patent
Plagmann et al.

(10) Patent No.: US 7,851,362 B2
(45) Date of Patent: Dec. 14, 2010

(54) METHOD FOR REDUCING AN UNEVENNESS OF A SURFACE AND METHOD FOR MAKING A SEMICONDUCTOR DEVICE

(75) Inventors: Joern Plagmann, Munich (DE); Holger Poehle, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 67 days.

(21) Appl. No.: 12/029,262

(22) Filed: Feb. 11, 2008

(65) Prior Publication Data

US 2009/0203220 A1    Aug. 13, 2009

(51) Int. Cl.
*H01L 21/302* (2006.01)
*H01L 21/491* (2006.01)

(52) U.S. Cl. .................. 438/692; 438/689; 438/443; 257/E21.23; 257/E21.304

(58) Field of Classification Search ......... 438/425–445, 438/689–692; 257/E21.23, E21.304
See application file for complete search history.

(56) References Cited

U.S. PATENT DOCUMENTS

| | | | |
|---|---|---|---|
| 5,736,451 A | 4/1998 | Gayet | |
| 5,976,950 A | 11/1999 | DiSimone et al. | |
| 5,998,280 A | 12/1999 | Bergemont et al. | |
| 6,034,402 A | 3/2000 | Ammo et al. | |
| 6,118,167 A | 9/2000 | DiSimone et al. | |
| 6,162,683 A * | 12/2000 | Chen | 438/258 |
| 6,258,711 B1 * | 7/2001 | Laursen | 438/633 |
| 2003/0032260 A1 * | 2/2003 | Ahn et al. | 438/443 |
| 2004/0120677 A1 * | 6/2004 | Mo Kang et al. | 385/129 |

FOREIGN PATENT DOCUMENTS

| | | |
|---|---|---|
| DE | 198 36 164 A1 | 5/1999 |
| DE | 198 40 385 A1 | 6/1999 |
| EP | 0 743 678 A1 | 11/1996 |
| JP | 08031810 A | 2/1996 |
| JP | 10 2006 0074305 A | 7/2006 |
| KR | 10 2003 0002758 A | 1/2003 |

\* cited by examiner

*Primary Examiner*—Alexander G Ghyka
*Assistant Examiner*—Abdulfattah Mustapha
(74) *Attorney, Agent, or Firm*—Slater & Matsil, L.L.P.

(57) ABSTRACT

In order to reduce an unevenness of a surface of a body, a sacrificial layer is applied to the surface, a chemical-mechanical polishing of the sacrificial layer and material of said body is performed to reduce the unevenness of the surface, and a remainder of the sacrificial layer, if any, may be removed.

24 Claims, 3 Drawing Sheets

METHOD FOR REDUCING AN UNEVENNESS OF A SURFACE AND METHOD FOR MAKING A SEMICONDUCTOR DEVICE

TECHNICAL FIELD

Embodiments of the invention relate to methods for reducing an unevenness of a surface of a body and to methods for making a semiconductor device.

BACKGROUND

Fabrication steps during semiconductor fabrication may result in uneven top surfaces of semiconductor wafers or other substrates. In order to improve further processing of such top surfaces of the semiconductor wafer or the substrate, it may be desirable to planarize the top surface prior to further processing same.

There is a need in the art for methods which permit for reducing an unevenness of a surface of a body in a controllable manner.

SUMMARY OF THE INVENTION

Embodiments of the invention provide for a method for reducing an unevenness of a surface of a body. In one example, a sacrificial layer is applied to the surface. A chemical/mechanical polishing is performed on the sacrificial layer and material of the body to reduce the unevenness of the surface.

BRIEF DESCRIPTION OF THE DRAWINGS

Many aspects of this disclosure can be better understood with reference to the following drawings. The components in the drawings are not necessary to scale. Moreover, in the drawings, like reference numerals designate corresponding parts throughout the several views.

In the cross-sectional views hatchings are omitted were appropriate in order to improve clarity of the drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
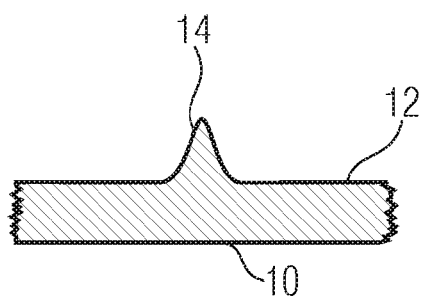
FIGS. 1a to 1d are schematic views of a body in cross-section, showing the process flow of an embodiment of the invention.

FIG. 1a shows a body 10 comprising a surface 12. The surface comprises an unevenness 14. The unevenness may be in the shape of an elevation as shown in FIG. 1a or may be in the form of a depression (as shown in FIG. 1e). While aspects of the invention will be described with respect to the embodiment of FIG. 1a, similar process steps could be applied with the starting point shown in FIG. 1e.

Figure 1B:
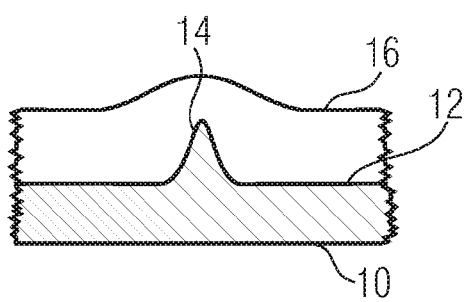

As shown in FIG. 1b, a sacrificial layer 16 is applied to the surface 12. In embodiments of the invention, the sacrificial layer 16 may be applied all-over the surface 12 or all-over at least a portion of the surface 12.

Figure 1C:
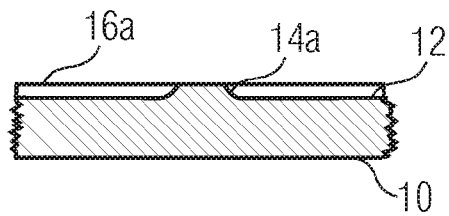
Figure 1D:
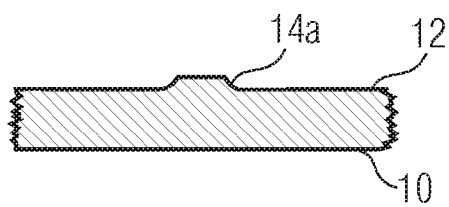
Figure 1E:
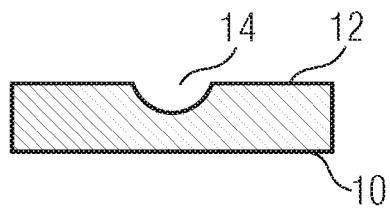
FIG. 1e is a schematic view of a body in cross-section, showing an alternative structure that could utilize aspects of the invention.

Upon applying the sacrificial layer 16, chemical-mechanical polishing of the sacrificial layer 16 and material of the body 12 is performed to reduce the unevenness 14 of the surface 12. The result is shown in FIG. 1c. To be more specific, in the embodiment shown, chemical-mechanical polishing from the top results in a planarized unevenness 14a since the height of the elevation 14 is reduced. If there is a remainder 16a of the sacrificial layer 16 after chemical-mechanical polishing, in embodiments of the invention it may be removed, as shown in FIG. 1d.

In embodiments of the invention, the body 12 and the sacrificial layer 16 may comprise any conceivable material suitable for chemical-mechanical polishing. In embodiments, the body and the sacrificial layer may be formed of materials suitable for semiconductor fabrication. In embodiments of the invention, the body may comprise an oxide, such as silicon oxide, and the sacrificial layer may comprise nitride, such as silicon nitride.

In embodiments of the invention, in the chemical-mechanical polishing, a polishing rate of a material of the sacrificial layer is lower than a polishing rate of the material of the body. In embodiments of the invention, this allows for control of the overall polishing rate. In embodiments of the invention, the polishing duration and, therefore, the amount of removed material can be selected such that a substantial planar surface of the body is obtained. In embodiments of the invention, the sacrificial layer may be removed completely during chemical-mechanical polishing thereof. In embodiments of the invention, the material of the body, the material of the sacrificial layer and parameters of the chemical-mechanical polishing process, such as the chemicals in the slurry used in chemical-mechanical polishing, may be such that the selectivity between the sacrificial layer and the material of the body is adjusted in a way that the polishing rate of the sacrificial layer is lower than the polishing rate of the body.

In the following, an embodiment of the invention is explained referring to a semiconductor fabrication process. In the semiconductor fabrication process, a substrate portion may be oxidized making use of a patterned masking layer. An example is a so-called LOCOS (local oxidation of silicon) process, typically using a patterned nitride layer as a masking layer. Standard bird heads, which are also referred to as bird beaks, i.e., elevations or protrusions, may be observed at the edges of the patterned masking layer. The height of the bird heads may increase with increased oxidation thickness. The resulting topology may affect subsequent process steps, such as resist coating or lithography. Embodiments of the invention may be directed to a reduction of an unevenness, e.g., a topology, resulting from such bird's heads.

Figure 2A:
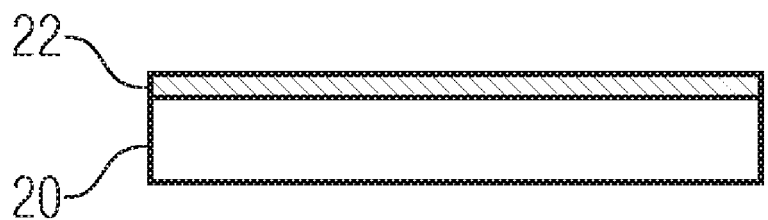
FIGS. 2a to 2f are schematic views of a semiconductor structure in cross-section, showing the process flow of an embodiment of the invention.

FIG. 2a shows a silicon body 20 and a silicon oxide layer 22, such as a $SiO_2$ layer, formed on a top surface of the silicon layer 20. The silicon oxide layer 22 is optional and may or may not be provided.

Figure 2B:
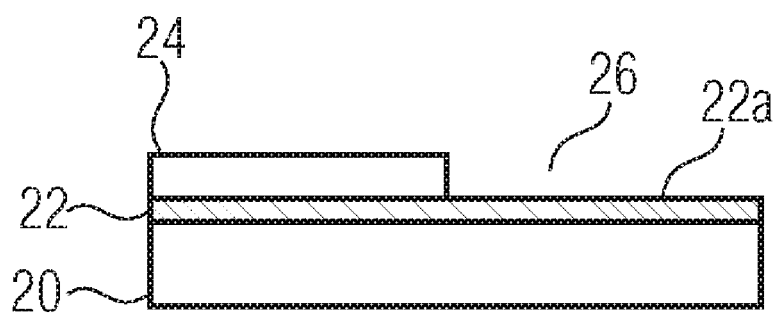

A patterned nitride mask 24 is provided over the silicon oxide layer 22 (or over the substrate 20 if the silicon oxide layer 22 is not provided) as shown in FIG. 2b. The patterned nitride mask 24 comprises a recess 26 exposing a portion 22a of the silicon oxide layer 22 (or of the substrate 20 if the silicon oxide layer is not provided).

Figure 2C:
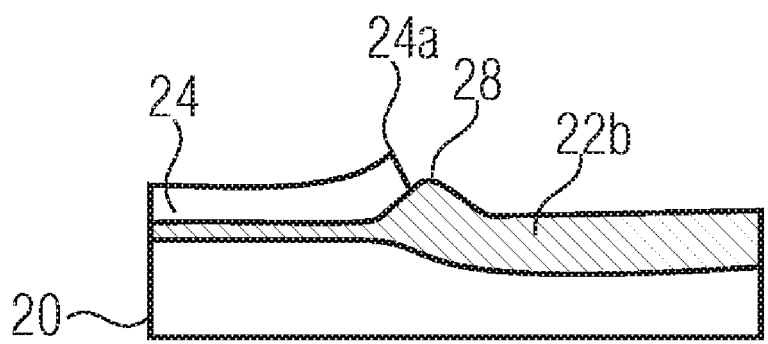

The structure shown in FIG. 2b is subjected to an oxidation process to form a thick oxide 22b in a region where the nitride 24 is not provided. In a LOCOS process, the thick oxide 22b may be called "field oxide." In embodiments of the invention, the oxidation process may comprise a thermal oxidation process. The resulting structure is shown in FIG. 2c. As can be seen in FIG. 2c, an elevation 28 is formed in the region of the border 34a of the nitride mask 24, which is known in the art as a so-called bird head.

In embodiments of the invention, depending on the thickness of the thick oxide 22b, oxidation may take place on top of the nitride mask 24 during generation of the thick oxide 22b. Thus, upon generation of the thick oxide 22b, a deglazing process may be performed to remove oxide material from the top of the nitride mask 24. In embodiments of the invention, the deglazing process may comprise a wet-chemical etching process.

After oxidation and optionally deglazing, an additional sacrificial layer 30 is applied to the top surface of the structure shown in FIG. 2c. In embodiments of the invention, the sacrificial layer is a nitride layer. In embodiments of the invention, the sacrificial layer is applied all-over the top surface of the structure shown in FIG. 2c. In embodiments of the invention, the patterned nitride layer 24 may be removed prior to applying the sacrificial layer 30.

In embodiments of the invention, the nitride layer 30 is applied using a low pressure chemical vapor deposition (LPCVD) or a plasma enhanced chemical vapor deposition (PECVD).

Figure 2D:
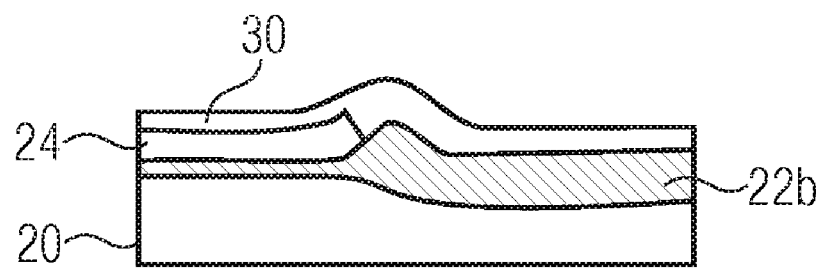
Figure 2E:
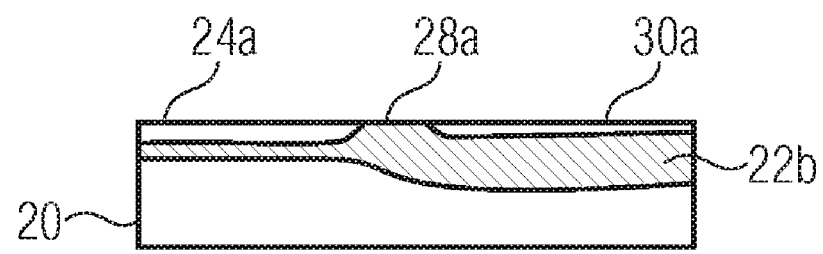

Subsequently, the top surface of the structure shown in FIG. 2d is subjected to a chemical-mechanical polishing process, during which the sacrificial layer 30 is at least partially removed and during which material is removed from the elevation 28 and from the patterned nitride mask 24. The resulting structure is shown in FIG. 2e. In this chemical-mechanical polishing process, the selectivity between the nitride layer 30 and the thermal oxide may be adjusted in a way that the polishing rate of the nitride layer 30 is lower than the polishing rate of the oxide.

In the embodiment shown in FIGS. 2a to 2f, remainders 24a and 30a of the nitride layers 24 and 30 may remain after the chemical-mechanical polishing process. An unevenness 28a having a reduced height when compared to the elevation 28 results from the chemical-mechanical polishing process.

Figure 2F:
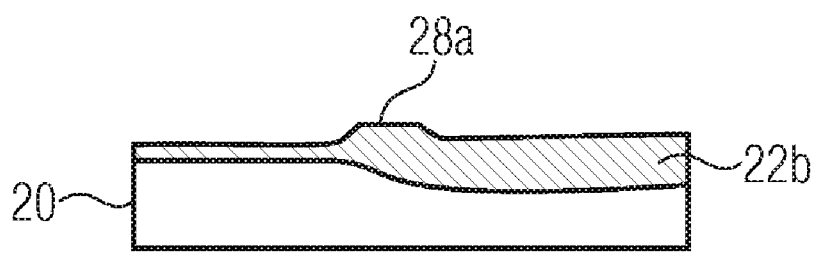

Subsequently, the remaining portions 24a and 30a of the nitride layers may be removed and a surface having a reduced unevenness when compared to the oxide surface shown in FIG. 2c is obtained. The resulting structure having the reduced unevenness is shown in FIG. 2f. In embodiments of the invention, the remaining portions 24a and 30a are removed using a common wet-chemical etching process. In embodiments of the invention, this wet-chemical etching process may correspond to a nitride wet strip process of a LOCOS process.

In embodiments of the invention, the duration of the chemical-mechanical polishing process may be adapted, e.g., increased, to remove the whole topology, such that a substantially planar surface is obtained. In embodiments of the invention, the polishing duration may be adjusted such that the whole sacrificial layer is removed during the polishing process, so that the step of removing the remainder of the nitride layer may be omitted.

In embodiments of the invention, an optional cleaning, such as an RCA cleaning may be performed after the chemical-mechanical polishing process. In embodiments of the invention, an additional deglazing process may be performed prior to removing the remaining portions 24a and 30a. Subsequently, in embodiments of the invention, an oxidation process may be performed in order to oxidize residual nitride (so called white ribbons) at the edge of the thick oxide (LOCOS edge). Such an oxidation process is generally known as "KOOI oxidation" according to the name of the person who introduced this process.

Compared to bird head planarization using an additional resist etch back technique, in embodiments of the invention, processes of resist coating, etching and resist removal may be replaced by processes of deglazing, applying a nitride layer and chemical-mechanical polishing.

Although, the present application has been described referring to specific embodiments, it is clear for a person skilled in the art that embodiments of the inventive methods are applicable to planarize the top surface of semiconductor wafers or other substrates in any conceivable fabrication stage, where a planarized surface may be helpful for further processing.

Many variations and modifications may be made to the above-described embodiments. All such modifications and variations are intended to be included herein within the scope of this disclosure and protected by the following claims.

What is claimed is:

1. A method for producing a component, the method comprising:
   processing a workpiece by oxidizing a portion of a substrate that is exposed by a recess in a patterned mask layer, thereby creating an unevenness;
   applying a sacrificial layer to a surface of the workpiece, the surface including the unevenness; and
   chemical-mechanical polishing the sacrificial layer and material of the workpiece.

2. The method of claim 1, further comprising, after chemical-mechanical polishing, removing any remainder of the sacrificial layer.

3. The method of claim 1, wherein the chemical-mechanical polishing is performed such that a polishing rate of a material of the sacrificial layer is lower than a polishing rate of the material of the workpiece.

4. The method of claim 1, wherein the material of the workpiece comprises oxide.

5. The method of claim 1, wherein the sacrificial layer comprises nitride.

6. The method of claim 1, further comprising deglazing the patterned mask layer after the oxidizing.

7. The method of claim 1, further comprising removing a remainder of the sacrificial layer and a remainder of the mask layer in a common process.

8. The method of claim 1, wherein applying the sacrificial layer comprises performing a low pressure chemical vapor deposition (LPCVD) or a plasma enhanced chemical vapor deposition (PECVD).

9. The method of claim 2, wherein removing any remainder of the sacrificial layer comprises wet etching the remainder of the sacrificial layer.

10. The method of claim 1, wherein the chemical-mechanical polishing substantially planarizes the surface.

11. A method of making a semiconductor device, the method comprising:
   forming a patterned mask over a surface of a semiconductor substrate, the patterned mask having a recess that exposes a portion of the surface of the semiconductor substrate or an oxide layer over the surface;
   oxidizing the semiconductor substrate in a region defined by the recess to form an oxide surface comprising an elevation adjacent a border of the recess;
   forming a sacrificial layer over the semiconductor substrate; and
   chemical-mechanical polishing the sacrificial layer and the elevation of the oxide layer to remove oxide material from the elevation.

12. The method of claim 11, further comprising, after the chemical-mechanical polishing, removing any remainder of the sacrificial layer, and/or any remainder of the patterned mask.

13. The method of claim 11, wherein the chemical-mechanical polishing is performed such that a polishing rate of the layer is lower than a polishing rate of the oxide.

14. The method of claim 11, wherein the semiconductor substrate comprises a silicon substrate.

15. The method of claim 11, further comprising deglazing the patterned mask prior to applying the sacrificial layer.

16. The method of claim 11, wherein forming the sacrificial layer comprises a low pressure chemical vapor deposition (LPCVD) or a plasma enhanced chemical vapor deposition (PECVD).

17. The method of claim 12, wherein removing any remainder of the sacrificial layer and/or any remainder of the patterned mask comprises performing a common wet-chemical etching process.

18. The method of claim 11, wherein the chemical-mechanical polishing substantially planarizes the oxide surface.

19. The method of claim 12, wherein forming a patterned mask comprises forming a patterned nitride mask.

20. The method of claim 11, wherein forming a sacrificial layer comprises forming a nitride layer.

21. A method of making a semiconductor device, the method comprising:
providing a layer comprising a bird head;
applying a sacrificial layer over the bird head; and
chemical-mechanical polishing the sacrificial layer and the bird head.

22. The method of claim 21, further comprising:
after the chemical-mechanical polishing, removing any remainder of the sacrificial layer.

23. The method of claim 21, wherein the bird head comprises oxide.

24. The method of claim 21, wherein the sacrificial layer comprises nitride.

* * * * *